United States Patent [19]

Wyatt

[11] Patent Number: 4,904,958
[45] Date of Patent: Feb. 27, 1990

[54] ENHANCED PHASE DETECTOR
[75] Inventor: Michael A. Wyatt, Clearwater, Fla.
[73] Assignee: Honeywell Inc., Minneapolis, Minn.
[21] Appl. No.: 318,898
[22] Filed: Mar. 3, 1989
[51] Int. Cl.4 ............................................. H03L 7/00
[52] U.S. Cl. ......................................... 331/17; 331/16; 331/25
[58] Field of Search ....................... 331/15, 16, 17, 25, 331/34, 177 V; 328/155; 307/511

[56] References Cited
U.S. PATENT DOCUMENTS
4,574,254 3/1986 Glance .................................. 331/17

Primary Examiner—Eugene R. Laroche
Assistant Examiner—Robert J. Pascal
Attorney, Agent, or Firm—Haugen and Nikolai

[57] ABSTRACT

An enhancement for a phase locked loop, where the enhanced phase locked loop includes a phase detector having an output and first and second inputs, the enhancement circuits of the invention, a loop filter and a voltage controlled oscillator having a control signal input and a signal output connected to the second input of the phase detector. One embodiment of the enhancement comprises a first amplifier for amplifying the output signal from the phase detector, a matched quad diode array having first and second nodes, a second amplifier and first, second and third resistors each having first and second terminals. The first terminal of the first resistor is connected to the first terminal of the third resistor and also connected in common to the first amplifier output. The second terminal of the third resistor is connected to the second node of the quad diode array, the first terminals of the first and third resistors and the inverting input of the second amplifier. The second amplifier's output is connected to the second terminal of the second resistor and further connected to the loop filter input. The loop fitler is, in turn, connected to the control signal input to complete the circuit for the enhanced phase locked loop. In operation, the control signal responds to variations in forward conductivity of the matched diode array which, in turn, responds to the voltage swings of the amplified phase detector output.

6 Claims, 2 Drawing Sheets

ENHANCED PHASE DETECTOR

U.S. GOVERNMENT RIGHTS

The United States Government has contributed to the design and development of the invention and has acquired certain rights therein.

BACKGROUND OF THE INVENTION

The invention is directed generally to an enhanced phase detector circuit and, more particularly, to an enhanced phase detector circuit for use in a phase locked loop.

Phase locked loops automatically track fluctuating input signals. FIG. 1 shows schematically a conventional phase locked loop circuit. A voltage control oscillator (VCO) 10 outputs a signal having a frequency controlled by the output voltage from phase detector 12 after it passes through loop filter 20. The phase detector voltage output is amplified and integrated by the loop filter. This causes the VCO frequency to move toward the frequency of the input signal. This process repeats until the VCO frequency equals the signal frequency and the loop is 'locked'. Phase locked loops are often used for communications applications such as receivers, tone decoders and other types of systems.

In such systems, it is advantageous to have high rates of signal acquisition and tracking and minimal loop slewing. The enhanced phase detector of the invention when utilized in a phase locked loop provides acquisition times and tracking rates an order of magnitude faster than conventional systems. Further, loop behavior does not degrade in the presence of noise which is an important factor when using a phase locked loop in a receiver network.

SUMMARY OF THE INVENTION

An enhancement for a phase locked loop, where the enhanced phase locked loop includes a phase detector having an output and first and second inputs, the enhancement circuits of the invention, a loop filter and a voltage controlled oscillator having a control signal input and a signal output connected to the second input of the phase detector is provided. One embodiment of the enhancement comprises a first amplifier for amplifying the output signal from the phase detector, a matched quad diode array having first and second nodes, a second amplifier and first, second and third resistors each having first and second terminals. The first terminal of the first resistor is connected to the first terminal of the third resistor and also connected in common to the first amplifier output. The second terminal of the third resistor is connected to the second node of the quad diode array, the first terminals of the first and third resistors and the inverting input of the second amplifier. The second amplifier's output is connected to the second terminal of the second resistor and further connected to the loop filter input. The loop filter is, in turn, connected to the control signal input to complete the circuit for the enhanced phase locked loop.

In operation, the control signal responds to variations in forward conductivity of the matched diode array which, in turn, responds to the voltage swings of the amplified phase detector output.

It is one object of the invention to provide an enhanced phase detector for use in a phase locked loop.

It is another object of the invention to provide a phase detector with improved signal acquisition rates.

It is yet another object of the invention to provide a phase detector having improved signal tracking and slew rates.

Other objects, features and advantages of the invention will become apparent to those skilled in the art through the claims, drawings and description of the preferred embodiment hereinbelow. In the drawings, like numerals refer to like elements.

DESCRIPTION OF THE PREFERRED EMBODIMENT

Figure 1:
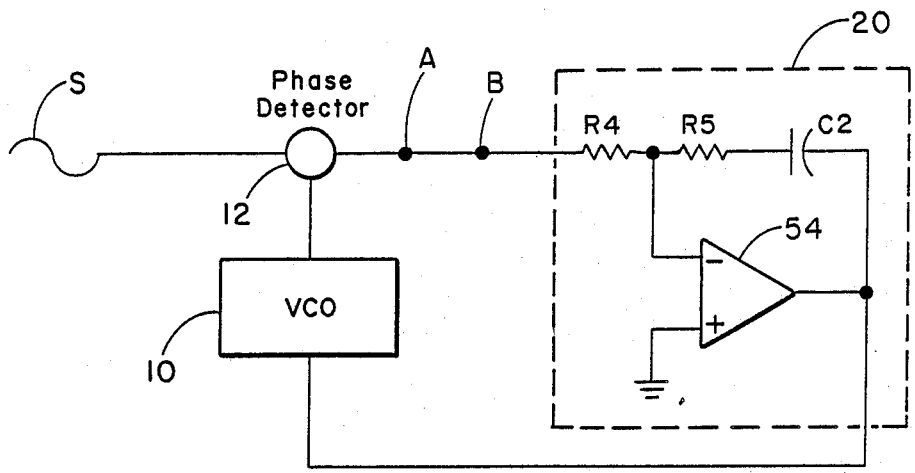
FIG. 1 schematically illustrates a conventional phase locked loop.
Figure 3:
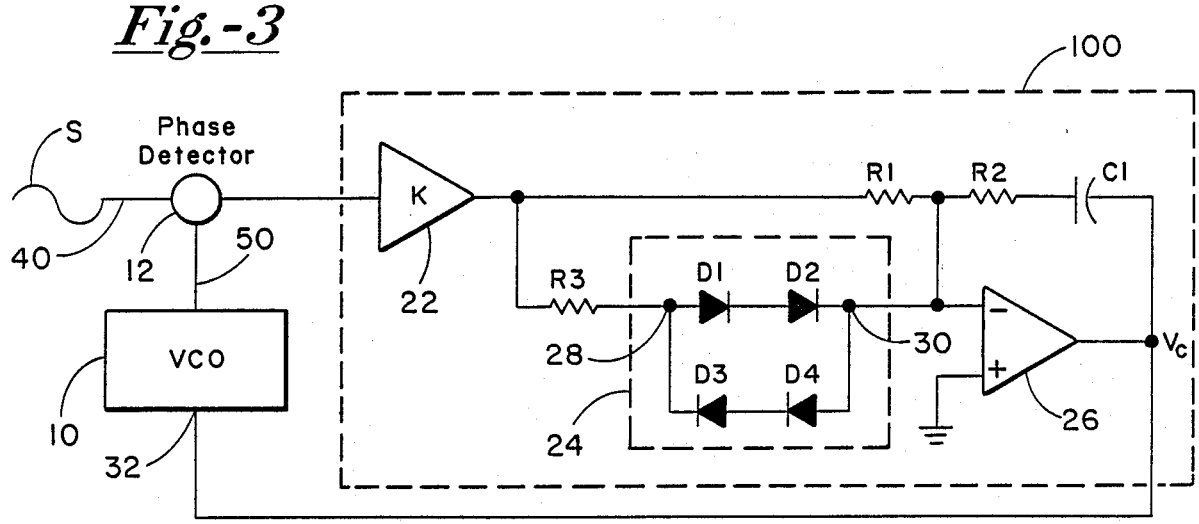
FIG. 3 schematically shows an alternative embodiment of the phase/loop filter enhancement circuit of the invention which enhances the operation of a conventional phase locked loop.
Figure 2:
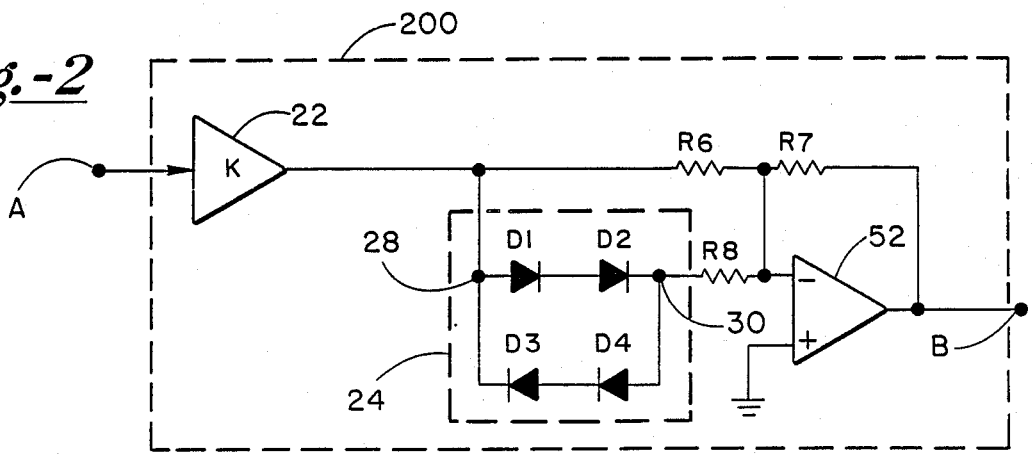
FIG. 2 schematically illustrates one embodiment of the phase enhancement circuit of the invention.

One embodiment of the phase enhancement circuit 200 of the invention is shown in FIG. 2. In normal use, the circuit 200 would be advantageously connected between nodes A and B of the conventional circuit shown in FIG. 1. Thus, in normal operations, the buffer amplifier 22 would receive the output of phase detector 12 and the loop filter 20 would be connected at node B to the output of a second amplifier 52. In this embodiment, resistor R8 is located between the diode array 24 and the inverting input of the second amplifier 52. The diode array 24 may be advantageously comprised of diodes D1, D2, D3, and D4 and have first and second nodes 28 and 30. As shown in FIGS. 2 and 3, the diodes are connected between nodes 28 and 30 in a manner such that the anode of D1 is connected to the cathode of D3, the cathode of D1 is connected to anode of D2, cathode of D2 is connected to the anode of D4 and the cathode of D4 is connected to the anode of D3. Resistors R6 and R7 are connected at first terminals to the inverting input of amplifier 52. Resistor R6 is connected at the its second terminal to the output of buffer amplifier 22. Resistor R7 is connected at its second terminal to node B. The diode array 24 is also connected to the second terminal of R6 and the output of amplifier 22. Buffer amplifier 22 may be any conventional amplifier, such as an operational amplifier, which provides enough gain to forward bias the diode array when the phase difference between the input voltages to the phase detector is about $+/-1.4$ volts for a typical diode array.

Referring now to FIG. 3, another embodiment of the enhanced phase locked loop of the invention is shown. The circuit includes a phase detector 12, a VCO 10 and a phase/loop filter enhancement circuit 100. The phase detector 12 and VCO 10 may be any conventional components as are commercially available and suitable for use. The loop is further comprised of buffer amplifier 22, first, second and third resistors R1, R2 and R3, diode array 24, operational amplifier 26 and capacitor C1. The buffer amplifier 22 amplifies the output signal of the phase detector 12 by a factor K. The output of the buffer amplifier 22 is then connected to first terminals of R1 and R3. The second terminal of R3 is connected to node 28. The second terminal of R1 is connected in common to node 30 of the diode array and the inverting input of the second amplifier 26 and further to a first terminal of R2. In this embodiment of the invention, a second terminal of R2 is connected to a first plate of capacitor of C1 and a second plate of capacitor C1 is connected to the output of the operational amplifier 26. The output of the operational amplifier 26 is then transmitted to VCO 10 at control input 32.

Having described the configuration of the elements in alternate embodiments of the invention, the operation of the invention will now be described to enhance understanding of the principles of the invention. With reference to the embodiments shown in FIG. 3, input signal, S, is provided at input 40 to the phase detector 12. The phase detector then provides an output corresponding to the difference in phase between the input of the signal at 40 and the output signal of the voltage controlled oscillator. The output signal of the phase detector is then amplified by a gain of K by buffering amplifier 22 and is passed through to the downstream filter circuit elements including the diode array, operational amplifier 26, and circuit elements R1, R2, C1 and R3. Note that the diode array 24 is advantageously a matched quad diode array. As the phase difference between the phase detector inputs changes, the array moves in and out of forward conduction. When the array conducts, the control signal voltage, Vc, provided by operational amplifier 26 is much larger providing greater effective signal acquisition and tracking capabilities in a phase locked loop application.

Figure 4:
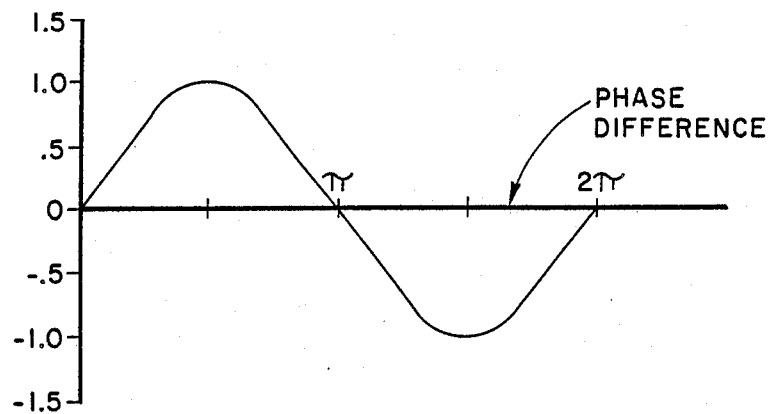
FIG. 4 graphically illustrates the classical output voltage of a conventional phase detector as it relates to phase differences between input voltages.
Figure 5:
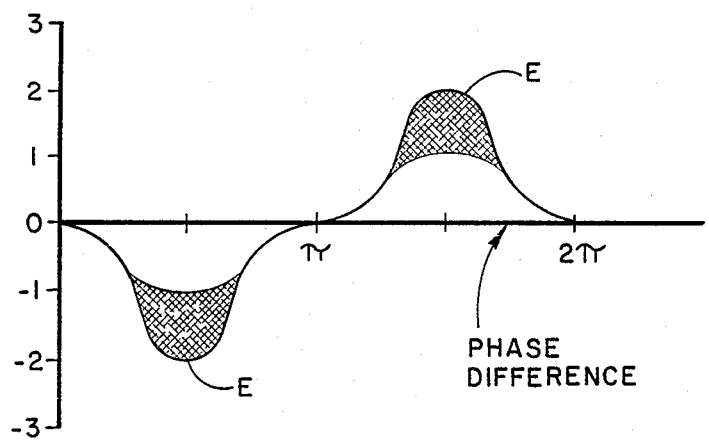
FIG. 5 graphically shows the enhancement signal provided by the phase enhancement circuit of the invention.

FIG. 4 shows the output voltage corresponding to phase differences over a 2 volt range for a conventional phase detector. In contrast, FIG. 5 shows in the cross-hatched areas, E, the voltage enhancement provided by the phase enhancement circuitry of the invention as measured at node B. With continuing reference to FIGS. 2 and 5, note that the amount of enhancement, E, is in large part determined by resistor R. One skilled in the art will recognize that if R* is taken to extremes, the operation of the enhancement circuitry will be adversely effected. That is, if the resistance present in R8 approaches zero, the diode array 24 will conduct too much current and drive the amplifier 52 into saturation. Conversely, if R8 approaches infinite resistance, the diode array will not conduct any current. Further, when used in a phase locked loop for detecting and tracking a signal buried in noise, the selection of a resistance value for R8 can greatly improve performance. In that regard, R8 should be selected such that it doesn't stress the slew rate characteristics of amplifier 52, while it also provides an acceptable amount of enhancement with high noise level inputs. Note that if the signal out of the phase detector is excessively enhanced, the loop will have difficulty in tracking a signal which is buried in noise at the input to the phase detector.

In contrast, now referring to the alternate embodiment shown in FIG. 3, the selection of a resistance value for R3 is not as critical as the selection of R8. This is due to the integrating effect of capacitor C1.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A phase locked loop comprising:
   (a) a phase detector having first and second inputs and an output;
   (b) a first means for amplifying the phase detector output;
   (c) a means for generating a voltage controlled oscillation signal to the first input, where the voltage controlled oscillation means includes a voltage control signal input; and
   (d) means for providing a control signal to the voltage control signal input wherein the means for providing a control signal further comprises first, second and third resistance means, an array of diodes, a second amplifying means and a capacitance means having first and second plates, wherein the diode array has first and second nodes and the first node is connected to one terminal of the third resistance means and the second node is connected to the inverting input of the second amplifying means and, wherein a first terminal of the first resistance means is connected to the second terminal of the third resistance means and also in common to the amplified phase detector output, further, wherein the second terminal of the first resistance means is connected to a first terminal of the second resistance means and also in common to the inverting input of the second amplifying means, further, wherein a second terminal of the second resistance means is connected to a first plate of the capacitance means and a second plate of the capacitance means is connected to the output of the second amplifying means, and wherein the control signal is responsive to the amplified phase detector output such that varying forward conduction of the amplified phase detector output increases the amplitude of the control signal when forward conduction is increased.

2. The apparatus of claim 1 wherein the array of detectors comprises a matched quad diode array.

3. A phase locked loop comprising:
   (a) a phase detector having first and second inputs and an output;
   (b) a first means for amplifying the phase detector output;
   (c) a means for generating a voltage controlled oscillation signal to the first input, where the voltage controlled oscillation means includes a voltage control signal input; and
   (d) means for providing a control signal to the voltage control signal input wherein the means for providing a control signal further comprises first, second, third, fourth and fifth resistance means, a capacitance means, an array of diodes, a second amplifying means and a third amplifying means wherein the diode array has first and second nodes and the first node is connected to one terminal of the third resistance means and the second node is connected to the inverting input of the second amplifying means, and, wherein a first terminal of the first resistance means is connected to the second terminal of the third resistance means and also in common to the amplified phase detector output, further, wherein the second terminal of the first resistance means is connected to a first terminal of the second resistance means and also in common to the inverting input of the second amplifying means, a second terminal of the second resistance means is connected to the output of the second amplifying means, the fourth resistance means has a first terminal connected to the output of the second amplifying means and a second terminal connected to a first terminal of the fifth resistance means and in common with the inverting input of the third amplifier means, and wherein the fifth resistance means has a second terminal connected to one side of the capacitance means, the capacitance means further has the other side connected to the output of the third amplifier means, and wherein the control signal is responsive to the amplified phase detector output such that varying forward conduction of the amplified phase detector output increases the amplitude of the control signal when forward conduction is increased.

4. The apparatus of claim 4 wherein the array of detectors comprises a matched quad diode array.

5. An enhancement for a phase locked loop including a phase detector having an output and first and second inputs and further including a voltage controlled oscillator having a control signal input and a signal output connected to a second input of the phase detector where the enhancement comprises:
 (a) a first amplifier for amplifying the output signal from the phase detector;
 (b) a matched quad diode array having first and second nodes;
 (c) first, second and third resistors each having first and second terminals where the first terminal of the first resistor is connected to the first terminal of the third resistor and connected in common to the first amplifier output, and further where the second terminal of the third resistor is connected to the first node of the quad diode array;
 (d) a second amplifier which includes an inverting input and an output wherein the inverting input is connected in common to the second node of the quad diode array, the second terminal of the first resistor and the second resistor's first terminal; and
 (e) a loop filter having an input connected to the output of the second amplifier and an output connected to the control signal input.

6. An enhancement for a phase locked loop including a phase detector having an output and first and second inputs and further including a voltage controlled oscillator having a control signal input and a signal output connected to a second input of the phase detector where the enhancement comprises:
 (a) a first amplifier for amplifying the output signal from the phase detector;
 (b) a matched quad diode array having first and second nodes;
 (c) first, second and third resistors each having first and second terminals where the first terminal of the first resistor is connected to the first terminal of the third resistor and connected in common to the first amplifier output, and further where the second terminal of the third resistor is connected to the first node of the quad diode array;
 (d) a capacitor having a first plate connected to the second terminal of the second resistor and having a second plate; and
 (e) a second amplifier includes an inverting input and an output wherein the inverting input is connected in common to the second node of the quad diode array, the second terminal of the first resistor and the second resistor's first terminal, and the amplifier output is connected to the second plate and the control signal input.

* * * * *